US009123671B2

(12) United States Patent
Chen et al.

(10) Patent No.: US 9,123,671 B2
(45) Date of Patent: Sep. 1, 2015

(54) SILICON WAFER STRENGTH ENHANCEMENT

(75) Inventors: Chi-Ming Chen, Zhubei (TW);
Chung-Yi Yu, Hsin-Chu (TW);
Chia-Shiung Tsai, Hsin-Chu (TW);
Ho-Yung David Hwang, Hsinchu (TW);
Alexander Kalnitsky, San Francisco, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 341 days.

(21) Appl. No.: 12/982,275

(22) Filed: Dec. 30, 2010

(65) Prior Publication Data
US 2012/0168911 A1    Jul. 5, 2012

(51) Int. Cl.
*H01L 21/322* (2006.01)
(52) U.S. Cl.
CPC .................................. *H01L 21/3225* (2013.01)
(58) Field of Classification Search
CPC ................. H01L 31/3226; H01L 21/265332
USPC ....................................................... 438/5, 471
See application file for complete search history.

(56) References Cited

U.S. PATENT DOCUMENTS

| 4,314,595 | A | * | 2/1982 | Yamamoto et al. | ............ 438/471 |
| 5,286,658 | A | * | 2/1994 | Shirakawa et al. | ............... 438/5 |
| 5,674,756 | A | * | 10/1997 | Satoh et al. | .................... 438/471 |
| 6,307,775 | B1 | * | 10/2001 | Forbes et al. | ............ 365/185.01 |
| 6,544,656 | B1 | | 4/2003 | Abe et al. | |
| 7,112,830 | B2 | | 9/2006 | Munns | |
| 7,547,925 | B2 | | 6/2009 | Wong et al. | |
| 7,598,108 | B2 | | 10/2009 | Li et al. | |
| 2005/0037596 | A1 | * | 2/2005 | Erokhin et al. | ............... 438/471 |
| 2007/0108456 | A1 | | 5/2007 | Wong et al. | |
| 2009/0140295 | A1 | * | 6/2009 | Kaya et al. | .................... 257/192 |

OTHER PUBLICATIONS

Kaneta et al. "Atomic configuration, stabilizing mechanism, and impurity vibrations of carbon-oxygen complexes in crystalline silicon". Physical Review B. vol. 46, No. 20. 1992.*

* cited by examiner

*Primary Examiner* — Allen Parker
(74) *Attorney, Agent, or Firm* — Haynes and Boone, LLP

(57) ABSTRACT

Provided is a method of fabricating a semiconductor device. The method includes: receiving a silicon wafer that contains oxygen; forming a zone in the silicon wafer, the zone being substantially depleted of oxygen; causing a nucleation process to take place in the silicon wafer to form oxygen nuclei in a region of the silicon wafer outside the zone; and growing the oxygen nuclei into defects. Also provided is an apparatus that includes a silicon wafer. The silicon wafer includes: a first portion that is substantially free of oxygen, the first portion being disposed near a surface of the silicon wafer; and a second portion that contains oxygen; wherein the second portion is at least partially surrounded by the first portion.

19 Claims, 7 Drawing Sheets

SILICON WAFER STRENGTH ENHANCEMENT

BACKGROUND

The semiconductor integrated circuit (IC) industry has experienced rapid growth in recent years. Technological advances in IC materials and design have produced various types of ICs that serve different purposes. The fabrication of some types of ICs may require forming a III-V family layer on a substrate, for example forming a gallium nitride layer on a substrate. These types of IC devices may include, as examples, light-emitting diode (LED) devices, radio frequency (RF) devices, and high power semiconductor devices.

Traditionally, manufacturers have formed the III-V family layer on a sapphire substrate. However, sapphire substrates are expensive. Thus, some manufacturers have been attempting to form III-V layers on a silicon substrate, which is cheaper. However, existing methods of forming a III-V family layer on a silicon substrate may result in wafer bending or distortion, especially if the fabrication involves drastic temperature changes. The wafer distortion may lead to defects, which reduces yield and degrades device performance.

Therefore, while existing methods of forming III-V family layers on silicon substrates have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the features are formed in direct contact, and may also include embodiments in which additional features may be formed interposing the features, such that the features may not be in direct contact. Various features may be arbitrarily drawn in different scales for the sake of simplicity and clarity.

Figure 1:
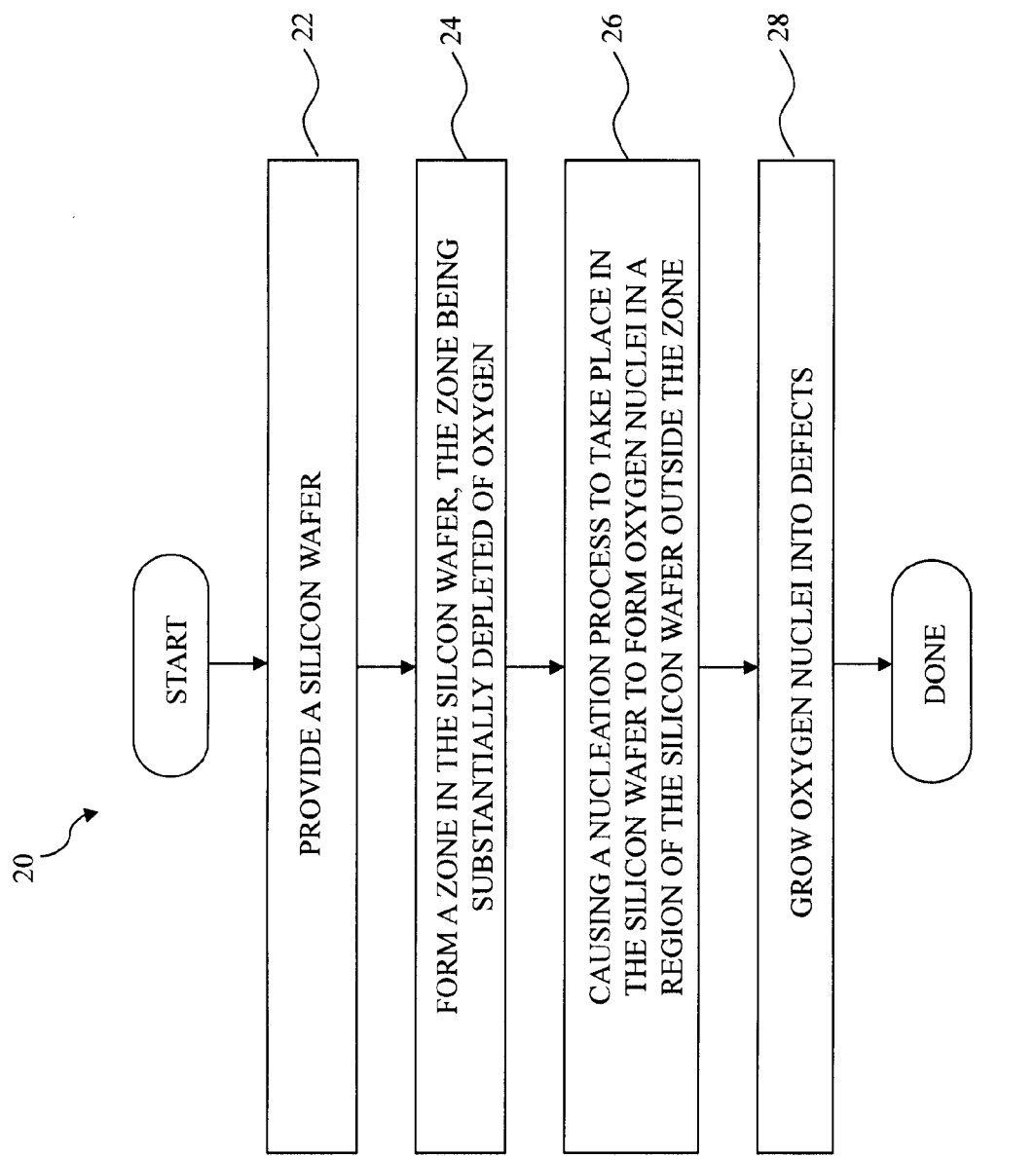
FIG. 1 is a flowchart illustrating a method for fabricating a semiconductor device according to various aspects of the present disclosure.

Illustrated in FIG. 1 is a flowchart of a method 20 for fabricating a semiconductor device according to various aspects of the present disclosure. Referring to FIG. 1, the method 20 begins with block 22, in which a silicon wafer is provided. The silicon wafer contains oxygen and may be oxygen-rich. The method continues with block 24, in which a zone is formed in a silicon wafer. The zone is substantially depleted of oxygen. The method continues with block 26, in which a nucleation process is caused to take place in the silicon wafer to form oxygen nuclei in a region of the silicon wafer outside the zone. The method continues with block 28, in which oxygen nuclei is grown into defects.

FIGS. 2 to 7 are diagrammatic fragmentary cross-sectional side views of a semiconductor device at various fabrication stages according to various aspects of the present disclosure. It is understood that FIGS. 2 to 7 have been simplified for a better understanding of the inventive concepts of the present disclosure.

Figure 2:
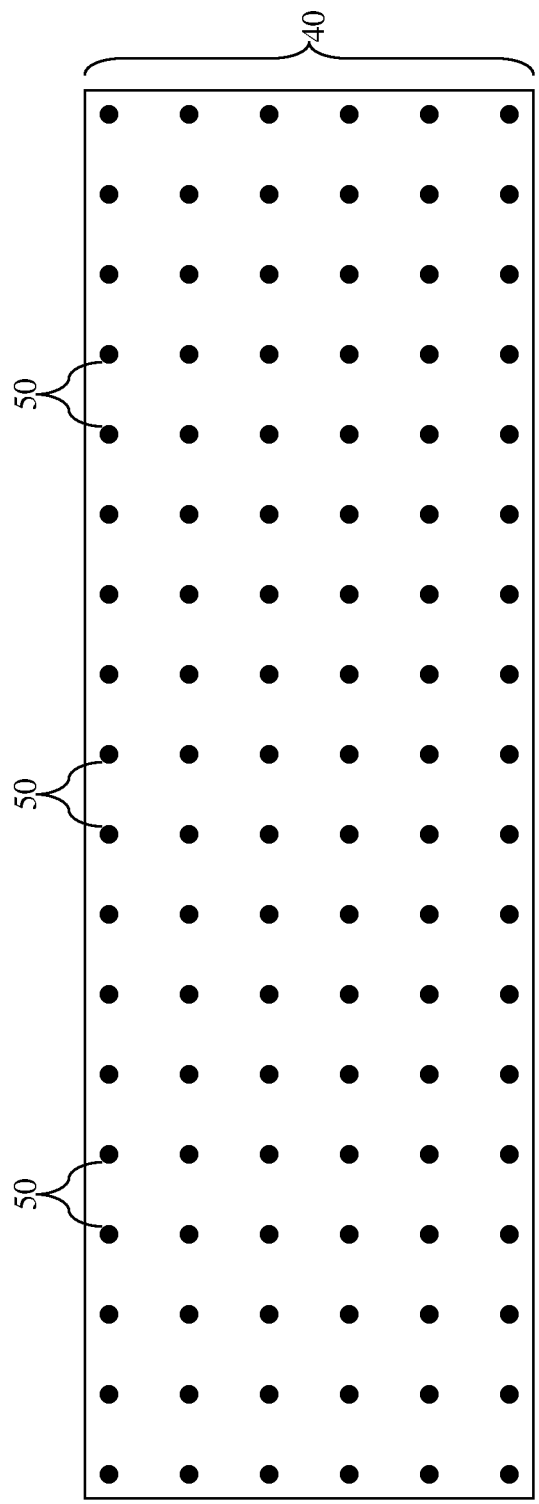
FIGS. 2-7 are diagrammatic fragmentary cross-sectional side views of a portion of a wafer at various stages of fabrication in accordance with various aspects of the present disclosure.

Referring to FIG. 2, a silicon wafer 40 is provided. The silicon wafer 40 may also be referred to as a silicon substrate 40. The silicon wafer 40 is oxygen-rich. In other words, the silicon wafer 40 has an oxygen content or oxygen concentration higher than that of a standard silicon wafer. As an example, a standard silicon wafer may have an oxygen concentration that is in a range from about 8 parts-per-million-atoms (PPMA) to about 15 PPMA. Here, the silicon wafer 40 may have an oxygen concentration that is greater than about 15 PPMA. In an embodiment, the silicon wafer 40 has an oxygen concentration that is in a range from about 10 PPMA to about 40 PPMA, for example from about 13 PPMA to about 30 PPMA.

Various processing methods may be used to cause the silicon wafer 40 to be oxygen-rich. In one embodiment, oxygen is purposefully introduced to the silicon wafer 40 during the crystal growth of the silicon wafer 40. In alternative embodiments, other methods may be used to make the silicon wafer 40 oxygen-rich, for example through one or more oxygen implantation processes. At this stage of fabrication, a plurality of oxygen atoms 50 is distributed throughout the silicon wafer 40 in an approximately uniform fashion. In other words, the oxygen atoms 50 are distributed approximately evenly within the silicon wafer 40. It is understood that FIG. 2 is showing only a portion of the silicon wafer 40, and the oxygen atoms 50 shown in FIG. 2 are merely diagrammatic illustrative examples and may not accurately represent accurate sizes/shapes and the distribution of oxygen atoms in a real world oxygen-rich silicon wafer 40.

Figure 3:
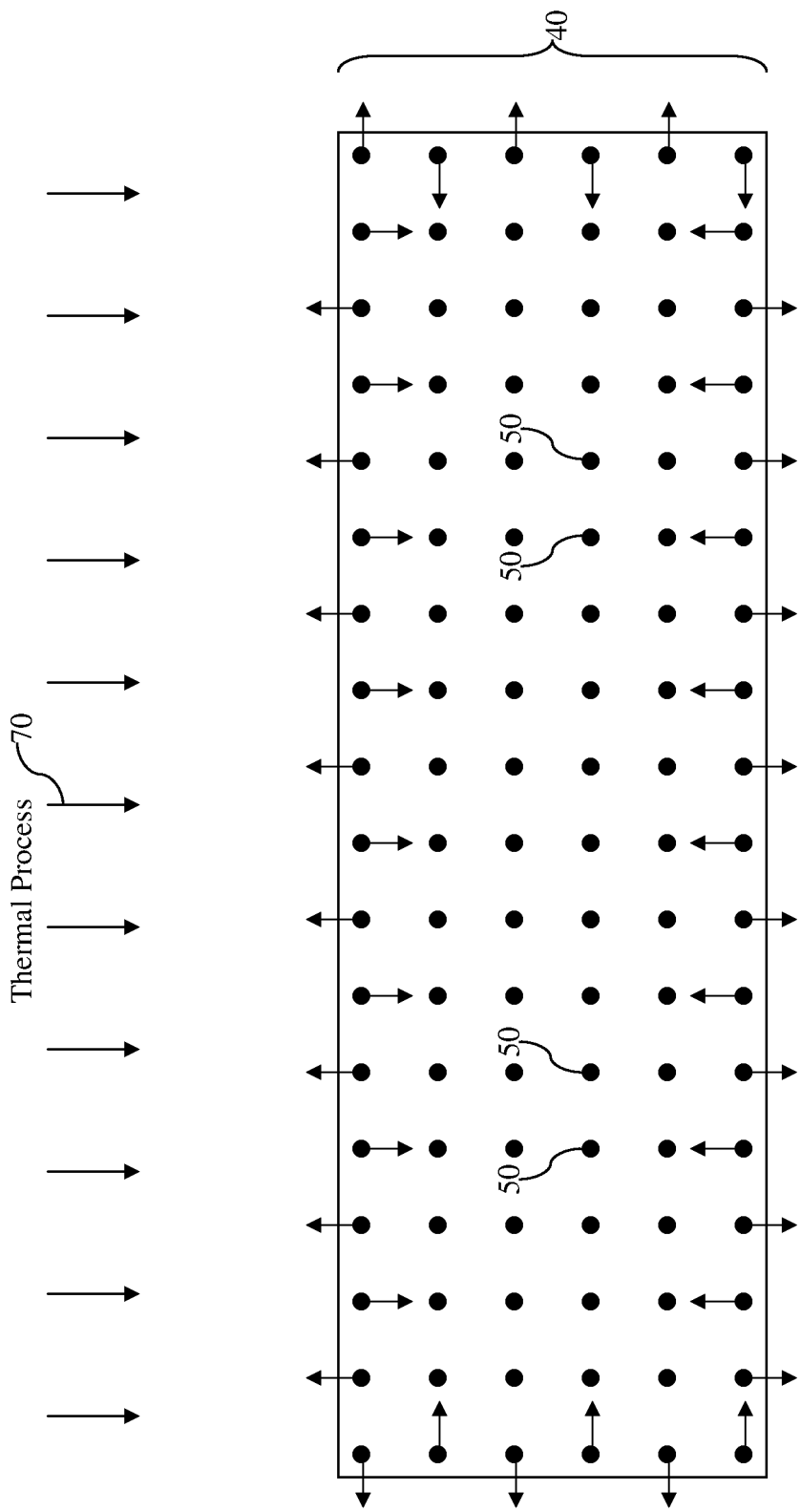

Referring now to FIG. 3, a thermal process 70 is performed on the silicon wafer 40. The thermal process 70 has a high process temperature that is greater than about 1000 degrees Celsius. In an embodiment, the process temperature of the thermal process 70 is greater than about 1100 degrees Celsius. The thermal processes 70 also has a process duration (the amount of time for which the thermal process is performed) that is greater than about 2 hours. In an embodiment, the process duration of the thermal process 70 is set to be in a range from about 2 hours to about 4 hours.

The process temperature for the thermal process 70 is set to be high (for example greater than about 1100 degrees Celsius) so as to induce oxygen out-diffusion in the silicon wafer 40. Oxygen out-diffusion means that oxygen atoms 50 are moving away from surfaces (or boundaries or edges) of the silicon wafer 40. For example, the oxygen atoms 50 can either move out of the silicon wafer 40, or further into the silicon wafer 40. Had the process temperature of the thermal process 70 not been high enough, oxygen out-diffusion would not have taken place, and other phenomena such as oxygen nucleation may have occurred instead, which would have been undesirable at this stage of fabrication.

Figure 4:
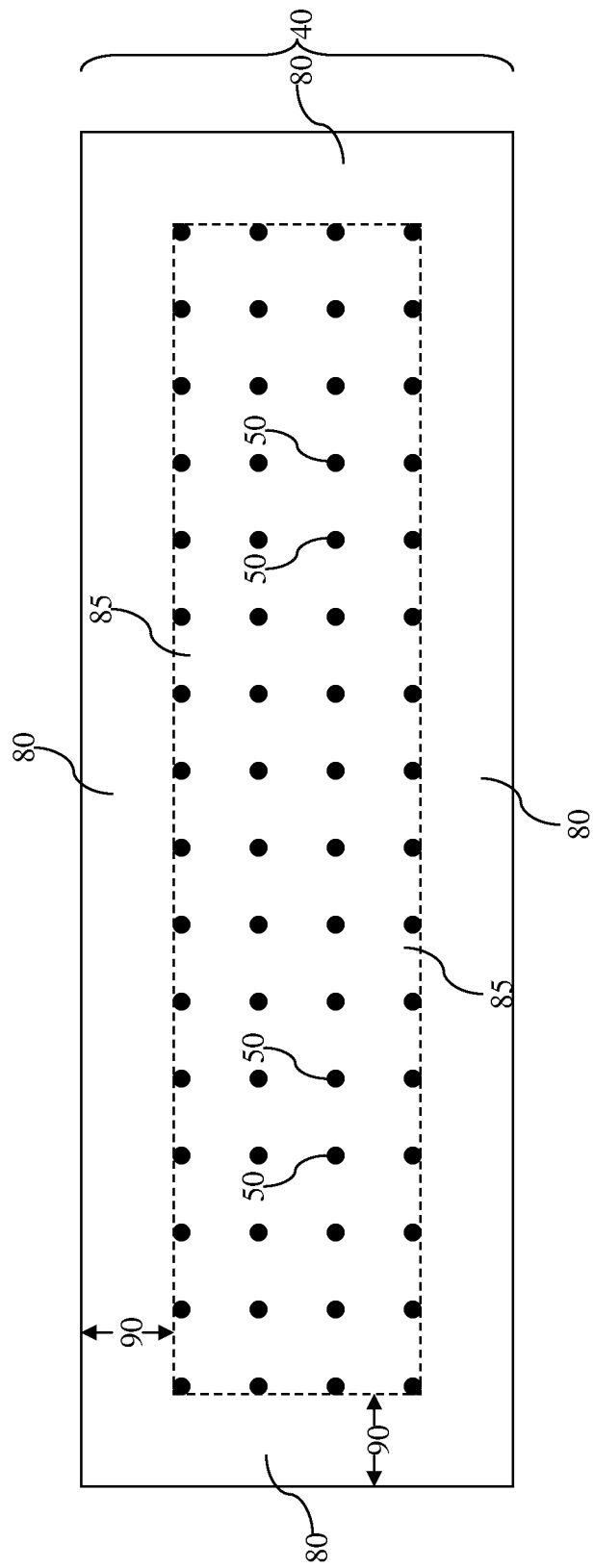

Referring to FIG. 4, the movement of oxygen atoms 50 away from the surfaces of the silicon 40 creates a zone 80 near the surfaces of the silicon wafer 40. The zone 80 contains substantially no oxygen atoms 50. In an embodiment, the oxygen content in the oxygen-free zone is less than about 1

PPMA. The zone 80 may also be referred to as an oxygen-free zone/region, an oxygen-depleted zone/region, or a denuded zone/region. For the sake of consistency, "oxygen-free zone" will be used to denote the zone 80 herein.

The oxygen-free zone 80 at least partially surrounds an inner region 85 of the silicon wafer 40 in which the oxygen atoms 50 have diffused. In the embodiment shown, the oxygen-free zone 80 completely surrounds the inner region 85. After the thermal process 70 is completed, the oxygen-free zone 80 has a depth 90. The depth 90 is measured from surfaces of the silicon wafer 40, as the oxygen-free zone 80 protrudes or extends into the silicon wafer 40. The size of the depth 90 is at least in part determined by (or correlated with) the total process duration of the thermal process 70 of FIG. 3. A longer process duration results in a deeper depth 90, and a shorter process duration results in a shallower depth 90. In an embodiment, the depth 90 is greater than about 1 micron (um), for example, in a range from about 1 um to about 15 um.

One of the reasons for the formation of the oxygen-free zone 80 is that these oxygen atoms 50 will result in defects in the silicon wafer 40 according to various aspects of the present disclosure, as will be discussed in more detail later. However, since semiconductor devices (such as transistor devices) will be formed over the silicon wafer 40, defects near the wafer surface is undesirable, because they may adversely impact the formation of the semiconductor devices or otherwise degrade their performance. Hence, the oxygen-free zone 80 is created in part to ensure that the semiconductor devices will not be formed over a wafer surface that has defects. Alternatively stated, the oxygen-free zone is formed in part to ensure a defect-free wafer surface.

Figure 5:
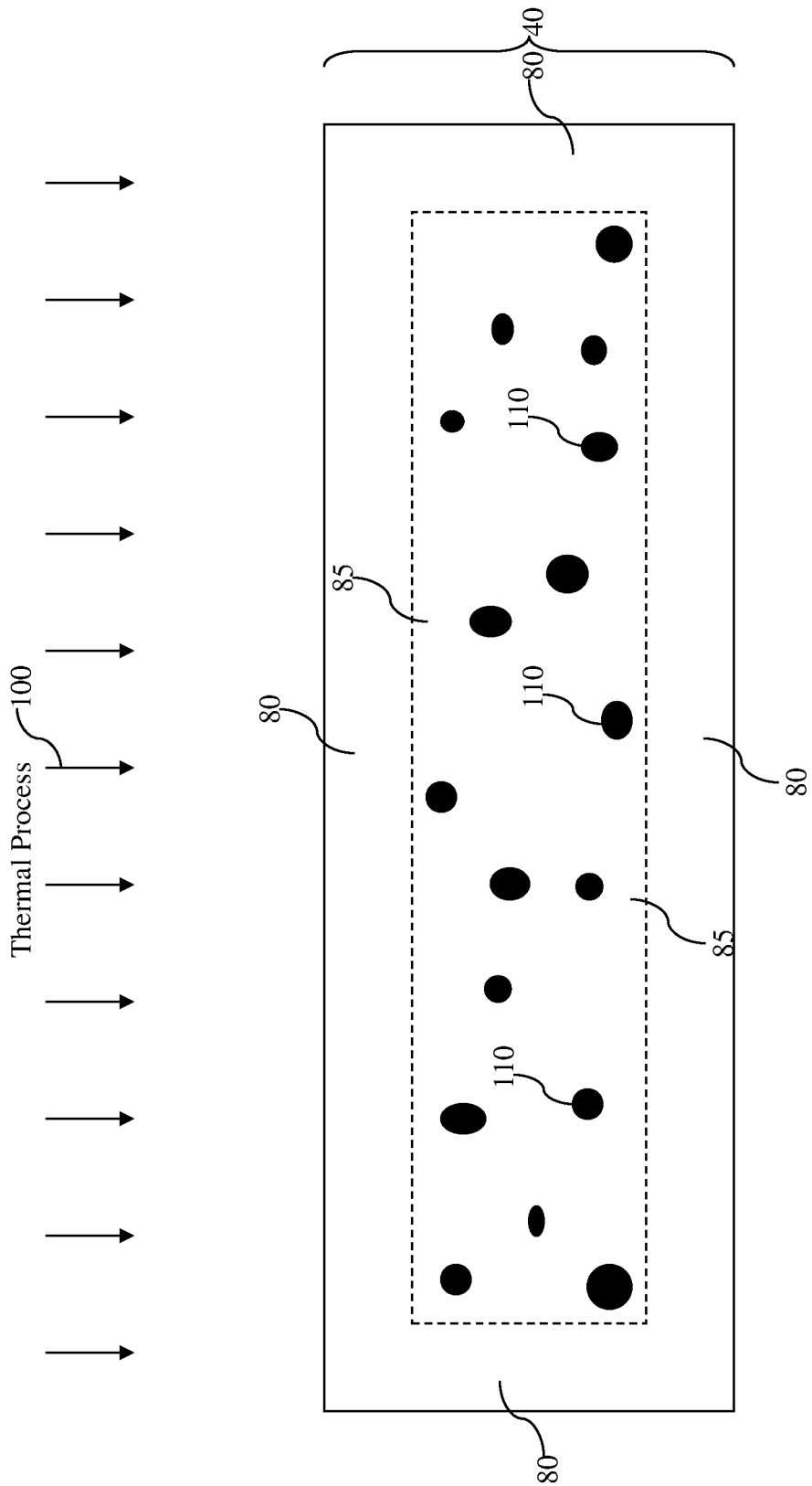

Referring now to FIG. 5, a thermal process 100 is performed on the silicon wafer 40. The thermal process 100 has a process temperature that is lower than the process temperature of the thermal process 70. In one embodiment, the silicon wafer 40 is cooled directly to the desired process temperature of the thermal process 100. In another embodiment, the silicon wafer 40 is cooled down to a room temperature (within about 20 degrees Celsius to about 30 degrees Celsius) first before being heated again to the desired process temperature of the thermal process 100.

The process temperature for the thermal process 100 is tuned to be within a range so as to cause an oxygen nucleation process to take place within the silicon wafer 40. More particularly, oxygen nucleation occurs in the inner region 85 of the silicon wafer. During oxygen nucleation, the small and stable oxygen atoms 50 will group together with other oxygen atoms randomly to form oxygen clusters, which are unstable. These oxygen clusters are unstable because they may randomly appear somewhere in the region 85 and then quickly disappear, until a critical size is reached. The oxygen clusters may be formed by using silicon atoms as forming sites. For example, one or more oxygen atoms may bond with one or more silicon atoms of the silicon wafer 40. The bonding of the oxygen and silicon atoms may help additional oxygen atoms to be formed thereon, thereby making the cluster bigger in size. The forming of the oxygen clusters may also be referred to as an oxygen precipitation process.

In any case, once an oxygen cluster reaches the critical size, that cluster becomes stable and will not disappear again. The stable oxygen cluster may also be referred to as an oxygen nucleus or an oxygen precipitate. Here, the thermal process 100 causes a plurality of oxygen nuclei (or oxygen precipitates) 110 to form in the region 85 of the silicon wafer 40. No oxygen nuclei are formed in the oxygen-free zone 80 because the oxygen-free zone contains no oxygen atoms 50 from which to form the oxygen nuclei 110. For reasons discussed above, the oxygen nuclei 110 are each bigger in size than the oxygen atoms 50, are distributed in the silicon wafer 40 in a random fashion, and may each include one or more silicon atoms therein. The oxygen nuclei 110 may also have differing sizes and shapes among one another. It is understood that the oxygen nuclei 110 in FIG. 5 are merely illustrated for the sake of providing an example and do not accurately represent oxygen nuclei formed in a real silicon wafer.

Since the thermal process 100 causes oxygen nucleation to take place, the thermal process 100 may also be referred to as a oxygen nucleation process. As mentioned above, to ensure that oxygen nucleation takes place, the process temperature of the thermal process 100 has to be controlled. In an embodiment, the process temperature of the thermal process 100 is set to be within a range from about 750 degrees Celsius to about 850 degrees Celsius.

Further, the number of oxygen nuclei 110 formed at the end of the thermal process 100 depends on the length of time that the thermal process 100 is performed. In other words, the oxygen nuclei density is correlated with the process duration of the thermal process 100. A longer process duration results in a greater number of oxygen nuclei 110, thereby increasing the oxygen nuclei density within the silicon wafer 40. Conversely, a shorter process duration results in a fewer number of oxygen nuclei 110, thereby decreasing the oxygen nuclei density within the silicon wafer 40.

Here, the process duration of the thermal process 100 is set to be longer than about 3 hours. In an embodiment, the process duration of the thermal process 100 is in a range from about 5 hours to about 10 hours. It is understood, however, that if the process duration continues to get longer, a saturation point may eventually be reached, when all the available oxygen atoms have been precipitated and have become parts of the oxygen nuclei 110. Therefore, the oxygen nuclei density will not increase once the saturation point has been reached, even if the process duration continues to increase.

Figure 6:
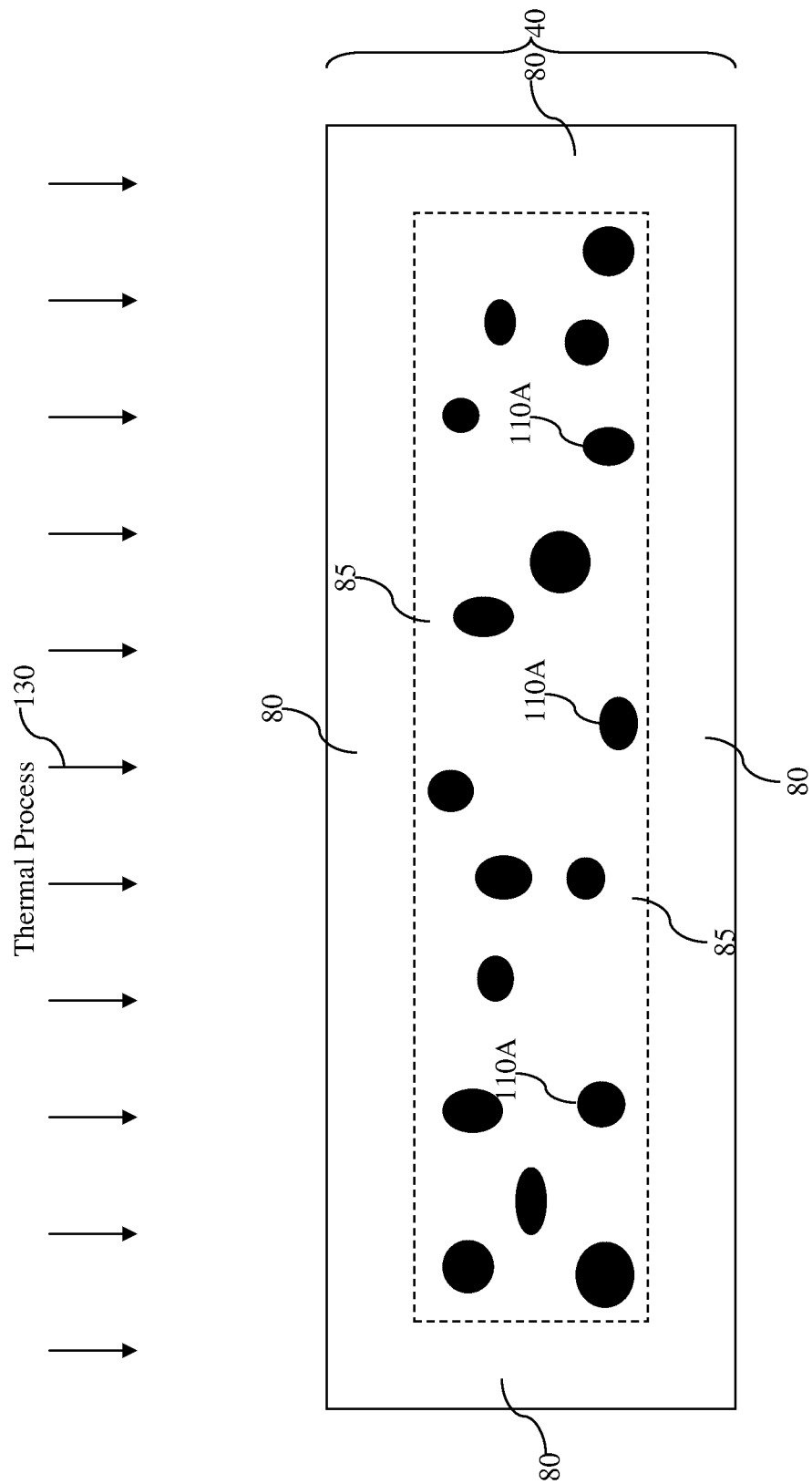

Referring to FIG. 6, after the thermal process 100 is performed and a desired number of oxygen nuclei 110 is formed in the silicon wafer 40, a thermal process 130 is performed to the silicon wafer 40. The thermal process 130 has a process temperature that is greater than the process temperature of the thermal process 100 but less than the process temperature of the thermal process 70. In one embodiment, the silicon wafer 40 is heated directly to the desired process temperature of the thermal process 130. In another embodiment, the silicon wafer 40 is cooled down to a room temperature first before being heated again to the desired process temperature of the thermal process 130.

The process temperature of the thermal process 130 is tuned to be within a range that facilitates the growth of the oxygen nuclei 110 within the silicon wafer 40. Stated differently, the process temperature of the thermal process 130 helps the oxygen nuclei 110 to grow into bigger oxygen nuclei 110A, which are also referred to as bulk micro defects (BMD) 110A. These bulk micro defects 110A may also be referred to as oxygen-induced bulk micro defects or oxygen-containing bulk micro defects.

In an embodiment, the process temperature of the thermal process 130 is about 1000 degrees Celsius. In another embodiment, the process temperature of the thermal process 130 is in a range from about 950 degrees Celsius to about 1050 degrees Celsius. The size of the bulk micro defects 110A is dependent on the process duration. A longer process duration results in bigger bulk micro defects 110A, and a shorter process duration results in smaller bulk micro defects 110A. In an embodiment, the process duration is longer than about 10 hours, for example in a range from about 15 hours to about 20 hours. In another embodiment, the process duration is long enough so that the bulk micro defects 110A have sizes that are in a range from about 5 um to about 10 um. The bulk micro defects 110A may correspond with the oxygen nuclei 110 on a one-to-one basis, respectively, since each bulk micro defect 110A is formed from one of the oxygen nuclei 110. It is understood that the bulk micro defects 110A also have varying shapes and sizes, which may not be accurately illustrated in FIG. 6.

The presence of the bulk micro defects 110A increases the strength of the wafer 40. This can be partly attributed to a pinning effect the bulk micro defects 110A have on the silicon crystalline in the silicon wafer 40. In general, the strength of a material is dependent on how easily dislocations in its crystal lattice can be propagated. The more difficult it is for the dislocations to be propagated, the harder the material. Here, the bulk micro defects 110A make it more difficult for the silicon crystalline to move around or otherwise dislocate in the wafer 40, because additional energy may be required for the silicon crystalline to get around the bulk micro defects 110A. Or conversely, additional energy is required for the bulk micro defects 110A to move around in the silicon wafer 40. Thus, the silicon crystalline and the bulk micro defects 110A are each "pinned down" in their respective locations in the silicon wafer 40. This pinning can also be referred to as a dislocation locking effect. Consequently, the strength of the silicon wafer 40 is increased, and it is harder for the silicon wafer 40 to be distorted.

The strength of the silicon wafer 40 is dependent on the density of the bulk micro defects 110A. As the density of the bulk micro defects 110A increases, so does the strength of the silicon wafer. In an embodiment, the density of the bulk micro defects 110A is greater than about $5 \times 10^7$ defects/centimeter$^3$. As discussed above, the density of the bulk micro defects 110A is tied with the density of the oxygen nuclei 110 formed as a result of the oxygen nucleation process in FIG. 5, and that a longer process duration of the thermal process 100 typically results in a greater oxygen nuclei density and thus a greater bulk micro defect density.

In some embodiments, a boron or phosphorous dopant can be used as dopants to implement a non-Radio Frequency (non-RF) device. In other embodiments, carbon, germanium, and nitrogen can be used as dopants to implement an RF device. The doping of the silicon wafer 40 with the P-type or N-type dopant also increases the strength of the silicon wafer due to a solid solution hardening effect. That is, when particles from a first element (i.e., the dopant) are added to the crystalline lattice of a second element (i.e., the silicon wafer 40), the particles from the first element can diffuse into the matrix of the second element to form a solid solution, thereby strengthening the second element. In this manner, the doping of the silicon wafer 40 with the P-type or N-type materials helps increase the strength of the wafer. In an embodiment, the P-type and N-type dopants are implanted into the silicon wafer using a dosage that is less than about $1.0 \times 10^{15}$ ions/centimeter$^2$.

One of the reasons why a strengthened silicon wafer 40 is desirable is that it works well as a substrate for the formation of a III-V family layer. A III-V family layer is a material having one element that is in the "III" family of the periodic table, and another material that is in the "V" family of the periodic table. One example of the III-V family is a gallium nitride material. Traditionally, III-V family layers such as gallium nitride layers are formed on sapphire substrates. However, sapphire substrates are relatively expensive, thus some manufacturers have been attempting to form III-V family layers on silicon substrates, which are cheaper than sapphire substrates.

One problem these manufacturers encounter is that the formation of a III-V family layer may require the wafer to undergo one or more high temperature processes (such as epitaxial growth processes) followed by cooling processes. The silicon wafer and the III-V family layer typically have very different coefficient-of-thermal-expansion (CTE). For example, the silicon wafer may have a CTE that is in a range from about $2.5 \times 10^{-6}/°$ C. to about $2.7 \times 10^{-6}/°$ C., whereas a gallium nitride layer may have a CTE that is in a range from about $5.1 \times 10^{-6}/°$ C. to about $6.1 \times 10^{-6}/°$ C. Due to these different CTEs, the silicon wafer and the III-V family layer may contract at different rates, which may cause the silicon wafer to bend or become otherwise distorted. The distortion of the silicon wafer is undesirable, as it may lead to defects or degradation of device performance.

Here, since the silicon wafer 40 is strengthened by the methods discussed above, it is less likely to become distorted during the forming of the III-V family layer, even though their respective CTEs are still different.

Figure 7:
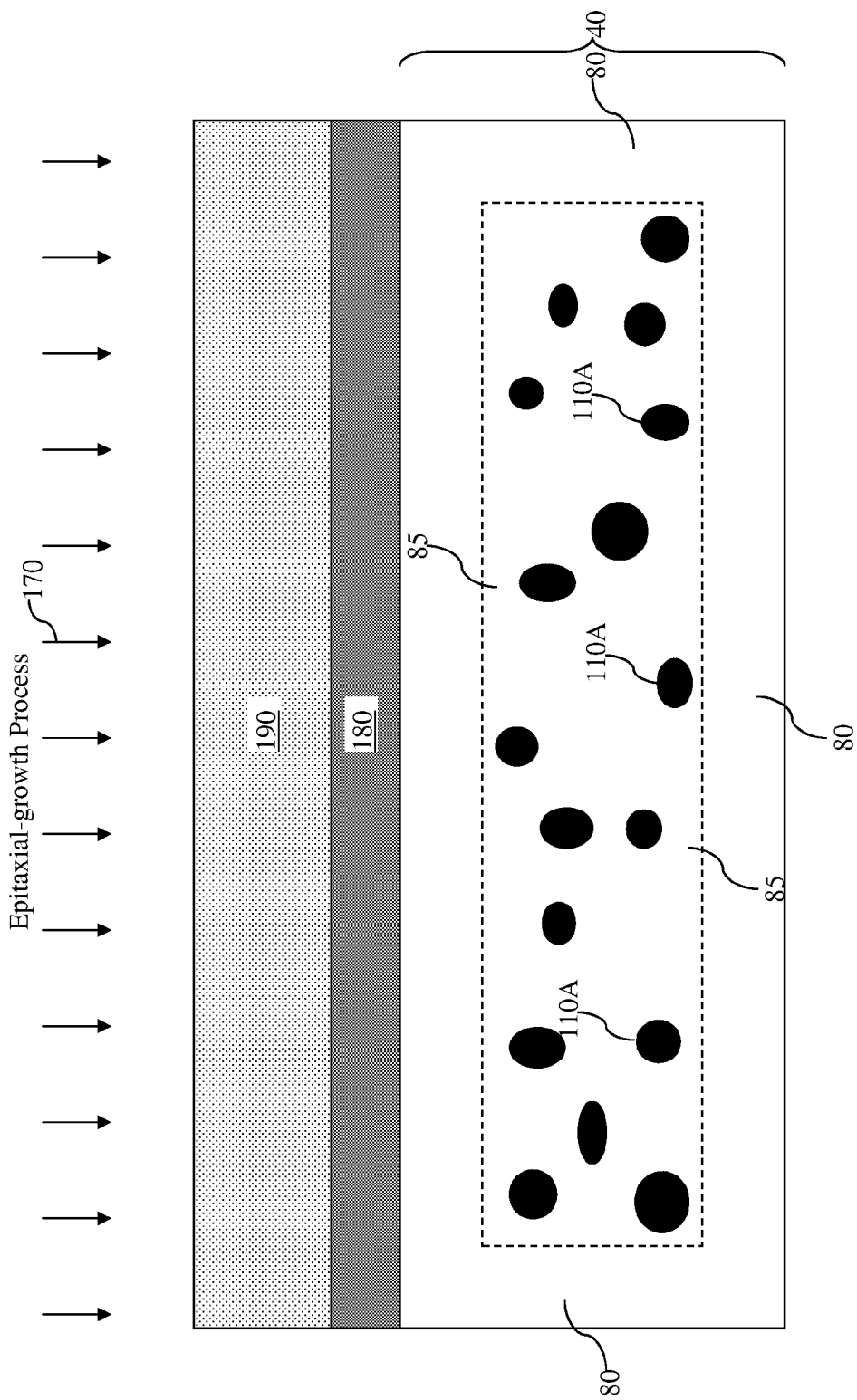

FIG. 7 illustrates the formation of a III-V family layer on the silicon wafer 40 as an example. One or more epitaxial-growth processes 170 (also referred to as epi processes or epi-growth processes) may be performed to form a buffer layer 180 on the silicon wafer 40, and a gallium nitride layer 190 on the buffer layer 180. The epitaxial processes 170 are performed under high temperatures. In one embodiment, the high temperatures are in a range from about 800 degrees Celsius to about 1400 degrees Celsius.

The buffer layer 180 may include a plurality of thin layers of aluminum nitride or aluminum gallium nitride. These thin layers of aluminum nitride or aluminum gallium nitride may each be as thin as a few nanometers (nm) or tens of nanometers. As discussed above, the gallium nitride layer 190 is one type of a III-V family layer.

After the gallium nitride layer 190 is formed, the overall device—including the silicon wafer 40 and the layers 180, and 190—is cooled to a room temperature. As the cooling takes place, the various layers contract according to their respective CTEs, which may create stress. Had a different silicon wafer been used, the stress created due to the mismatched CTEs may cause the silicon wafer to bend or become distorted (also referred to as wafer bow). Here, since the silicon wafer 40 is strengthened by the bulk micro defects 110A, the wafer is strong enough to withstand the stress and will not become substantially distorted. In an embodiment, the distortion (measured by wafer bow) of the silicon wafer 40 is less than about 25 um.

Also note that the layers 180 and 190 are formed over the oxygen-free zone 80, which is now also a defect-free zone. Had the oxygen-free zone 80 not been formed, defects near the upper surface of the silicon wafer 40 may lead to defects in the layers 180 or 190, thereby degrading device performance or yield.

It is understood that the gallium nitride layer 190 (or other types of III-V family layer that can be formed on the silicon wafer 40) may be used to form a plurality of types of semiconductor devices. For example, these semiconductor devices may include light-emitting diode (LED) devices, radio-frequency (RF) devices, high electron mobility transistor (HEMT) devices, and/or high power devices. In fact, as long as it is desirable to form a III-V family layer on a silicon wafer without substantial distortion of the wafer, the methods disclosed by the present disclosure may be applied.

The embodiments of the present disclosure discussed above offer advantages over existing methods. It is understood, however, that other embodiments may offer different advantages, and that no particular advantage is required for any embodiment. One of the advantages is that the strength of the silicon wafer 40 is increased by the bulk micro defects 110A. Thus, the silicon wafer 40 will exhibit less wafer bow or distortion as it undergoes the fabrication processes used to form a III-V family layer, such as a gallium nitride layer. As such, defects related to wafer distortion may be reduced.

Another advantage is that the oxygen-free zone 80 is formed in a sense to reserve a defect-free region near the boundaries or surfaces of the silicon wafer 40, so that future layers can be formed over a defect-free surface. This also prevents defects in the future layers.

Another advantage is that the methods described by the embodiments herein are inexpensive to implement. For example, the silicon wafer 40 can be made to be oxygen-rich during crystal growth, which requires no extra processes. Further, the forming of the bulk micro defects 110A requires no additional materials either, since they are formed based on oxygen precipitates. The various thermal processes discussed above can be easily carried out as well. Therefore, the implementation of the methods of the present disclosure has minimal impact on fabrication costs.

One of the broader forms of the present disclosure involves a method. The method includes a method. The method includes receiving a silicon wafer that contains oxygen. The method also includes forming a zone in the silicon wafer, the zone being substantially depleted of oxygen. The method also includes causing a nucleation process to take place in the silicon wafer to form oxygen nuclei in a region of the silicon wafer outside the zone. The method also includes growing the oxygen nuclei into defects.

Another of the broader forms of the present disclosure involves a method of fabricating a semiconductor device. The method includes receiving a silicon wafer that contains oxygen. The method also includes performing a first thermal process to the silicon wafer to make a first portion of the silicon wafer oxygen-free. The first portion is formed proximate to a surface of the silicon wafer. The method also includes performing a second thermal process to the silicon wafer to cause oxygen nucleation to take place in a second portion of the silicon wafer different from the first portion. The oxygen nucleation results in oxygen precipitates in the second portion. The method also includes performing a third thermal process to the silicon wafer to grow the oxygen precipitates into defects.

Still another of the broader forms of the present disclosure involves an apparatus. The apparatus includes a silicon wafer. The silicon wafer includes a first portion that is substantially free of oxygen. The first portion is disposed near a surface of the silicon wafer. The silicon wafer includes a second portion that contains oxygen. The second portion is at least partially surrounded by the first portion.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
receiving a silicon wafer;
implanting oxygen to the silicon wafer through one or more implantation processes, thereby transforming the silicon wafer into an oxygen-rich silicon wafer, wherein the oxygen-rich silicon wafer has an oxygen concentration greater than about 15 parts-per-million-atoms;
forming a zone in the oxygen-rich silicon wafer, by subjecting the oxygen-rich silicon wafer to a first temperature high enough to cause oxygen out-diffusion and for a first duration, the zone being substantially depleted of oxygen;
causing a nucleation process to take place, at a silicon atom forming site in the oxygen-rich silicon wafer, by subjecting the oxygen-rich silicon wafer to a second temperature less than the first temperature and for a second duration greater than the first duration, to form oxygen nuclei in a region of the oxygen-rich silicon wafer outside the zone, wherein after forming the zone in the oxygen-rich silicon wafer and before causing the nucleation process to take place, cooling the oxygen-rich silicon wafer to a room temperature; and
growing the oxygen nuclei into defects, by subjecting the oxygen-rich silicon wafer to a third temperature greater than the second temperature but less than the first temperature and for a third duration greater than the second duration.

2. The method of claim 1, wherein:
the first temperature is greater than about 1100 degrees Celsius;
the second temperature is in a range from about 750 degrees Celsius to about 850 degrees Celsius; and
the third temperature is in a range from about 950 degrees Celsius to about 1050 degrees Celsius.

3. The method of claim 1, wherein:
the first duration is more than about 2 hours;
the second duration is more than about 3 hours; and
the third duration is more than about 10 hours.

4. The method of claim 1, wherein the forming the zone is carried out in a manner so that the zone extends from surfaces of the oxygen-rich silicon wafer into the oxygen-rich silicon wafer by an amount that is greater than about 1 micron.

5. The method of claim 1, further including: forming a III-V family layer over the oxygen-rich silicon wafer.

6. The method of claim 1, wherein after causing the nucleation process to take place and before growing the oxygen nuclei into defects, cooling the oxygen-rich silicon wafer to the room temperature.

7. A method of fabricating a semiconductor device, comprising:
introducing oxygen to a silicon wafer during a crystal growth of the silicon wafer such that the silicon wafer becomes an oxygen-rich silicon wafer with an oxygen concentration greater than about 15 parts-per-million-atoms;
performing a first thermal process to the oxygen-rich silicon wafer, by subjecting the oxygen-rich silicon wafer to a first temperature high enough to cause oxygen out-diffusion and for a first duration, to make a first portion of the oxygen-rich silicon wafer oxygen-free, the first portion being formed proximate to a surface of the oxygen-rich silicon wafer;
performing a second thermal process to the oxygen-rich silicon wafer, by subjecting the oxygen-rich silicon wafer to a second temperature less than the first temperature and for a second duration greater than the first duration, to cause oxygen nucleation to take place at a silicon atom forming site, in a second portion of the oxygen-rich silicon wafer different from the first portion, the oxygen nucleation resulting in oxygen precipitates in the second portion, wherein after performing the first thermal process and before performing the second thermal process, cooling the oxygen-rich silicon wafer to a room temperature; and thereafter performing a third thermal process to the oxygen-rich silicon wafer to grow the oxygen precipitates into defects, by subjecting the oxygen-rich silicon wafer to a third temperature greater than the second temperature but less than the first temperature and for a third duration greater than the second duration.

8. The method of claim 7, further including:

forming a gallium nitride layer over the surface of the oxygen-rich silicon wafer at a temperature that is in a range from about 800 degrees Celsius to about 1400 degrees Celsius; and thereafter cooling the oxygen-rich silicon wafer and the gallium nitride layer down to about a room temperature.

9. The method of claim 7, wherein:

the first temperature is greater than about 1100 degrees Celsius and the first duration is in a range from about 2 hours to about 4 hours;

the second temperature is in a range from about 750 degrees Celsius to about 850 degrees Celsius and the second duration is in a range from about 5 hours to about 10 hours; and the third temperature is in a range from about 950 degrees Celsius to about 1050 degrees Celsius and the third duration is in a range from about 15 hours to about 20 hours.

10. The method of claim 7, wherein:

the first thermal process is carried out in a manner so that the first portion of the oxygen-rich silicon wafer at least partially surrounds the second portion of the oxygen-rich silicon wafer; and the first portion of the oxygen-rich silicon wafer has a depth measured from the surface of the oxygen-rich silicon wafer, the depth being in a range from about 1 micron to about 15 microns.

11. The method of claim 7, wherein the first, second, and third thermal processes are carried out in a manner so that the second portion of the oxygen-rich silicon wafer has a defect density that is greater than about $5 \times 10^7$ defects/centimeter$^3$.

12. A method, comprising:

providing an oxygen-rich silicon wafer, wherein the oxygen-rich silicon wafer is produced by introducing oxygen to a silicon wafer during a crystal growth of the silicon wafer or by implanting oxygen to the silicon wafer through one or more implantation processes, and wherein the oxygen-rich silicon wafer has a greater oxygen content than a standard silicon wafer;

forming a zone in the oxygen-rich silicon wafer, by subjecting the oxygen-rich silicon wafer to a first temperature high enough to cause oxygen out-diffusion and for a first duration, the zone being substantially depleted of oxygen, wherein the zone is distributed near surfaces of the oxygen-rich silicon wafer;

forming oxygen nuclei in a region of the oxygen-rich silicon wafer surrounded by the zone, by subjecting the oxygen-rich silicon wafer to a second temperature less than the first temperature and for a second duration greater than the first duration, wherein the oxygen nuclei is formed by a nucleation process at a silicon atom forming site, wherein after forming the zone in the oxygen-rich silicon wafer and before forming oxygen nuclei in the region of the oxygen-rich silicon wafer surrounded by the zone, cooling the oxygen-rich silicon wafer to a room temperature; and transforming the oxygen nuclei into defects in the oxygen-rich silicon wafer, by subjecting the oxygen-rich silicon wafer to a third temperature greater than the second temperature but less than the first temperature and for a third duration greater than the second duration.

13. The method of claim 12, wherein the oxygen content of the oxygen-rich silicon wafer is at least 15 parts-per-million atoms.

14. The method of claim 12, wherein the oxygen-rich silicon wafer is obtained by introducing oxygen to a standard silicon wafer through one or more implantation processes.

15. The method of claim 12, wherein:

the first temperature is greater than about 1100 degrees Celsius and the first duration is more than about 2 hours;

the second temperature is between about 750 degrees Celsius and about 850 degrees Celsius and the second duration is more than about 3 hours; and the third temperature is between about 950 degrees Celsius and about 1050 degrees Celsius and the third duration is more than about 10 hours.

16. The method of claim 12, further comprising, after the transforming:

growing one or more III-V family layers over the oxygen-rich silicon wafer at temperatures between about 800 degrees Celsius and about 1400 degrees Celsius; and thereafter cooling the oxygen-rich silicon wafer and the one or more III-V family layers grown thereon to a room temperature.

17. The method of claim 12, wherein the defects in the oxygen-rich silicon wafer have a defect density greater than about $5 \times 10^7$ defects/centimeter$^3$.

18. The method of claim 12, wherein the transforming is performed in a manner such that the defects each have a size in a range from about 5 microns to about 10 microns.

19. The method of claim 12, wherein after forming oxygen nuclei in the region of the oxygen-rich silicon wafer surrounded by the zone and before transforming the oxygen nuclei into defects, cooling the oxygen-rich silicon wafer to the room temperature.

* * * * *